United States Patent [19]

Tsuda et al.

[11] 4,363,977

[45] Dec. 14, 1982

[54] DEVICE FOR DISCRIMINATING BETWEEN TWO VALUES OF A SIGNAL WITH DC OFFSET COMPENSATION

[75] Inventors: Toshitaka Tsuda, Kawasaki; Kazuo Murano, Tokyo; Kazuo Yamaguchi, Hiratsuka; Takafumi Chujo; Norio Murakami, both of Yokohama; Motohide Takahashi, Kawasaki, all of Japan

[73] Assignee: Fujitsu Limited, Kawasaki, Japan

[21] Appl. No.: 236,609

[22] Filed: Feb. 20, 1981

[30] Foreign Application Priority Data

Feb. 20, 1980 [JP] Japan .................................. 55/19992
Jun. 26, 1980 [JP] Japan .................................. 55/87060

[51] Int. Cl.³ ........................ H03K 5/153; H03K 5/01
[52] U.S. Cl. .................................... 307/358; 307/264;
307/351; 307/562; 328/165; 330/9; 330/11

[58] Field of Search ............... 307/264, 359, 351, 546, 307/555, 562, 311; 328/162, 165, 168, 175; 358/34, 36, 71; 340/146.3 AC, 146.3 AE, 146.3 AG; 330/9, 11

[56] References Cited

U.S. PATENT DOCUMENTS

| 3,473,131 | 10/1969 | Perkins, Jr. | 307/359 |
| 4,156,854 | 5/1979 | Weller | 307/264 |
| 4,328,434 | 5/1982 | Geller | 307/359 |

Primary Examiner—John Zazworsky
Attorney, Agent, or Firm—Staas & Halsey

[57] ABSTRACT

A device for discriminating between two values of a signal using DC offset compensation including an automatic gain control circuit, a peak detector circuit and a feedback path from the peak detector circuit to the input circuit of the automatic gain control circuit. The value of the feedback current is regulated so that the maximum value of one of the same polarity signals and the opposite polarity signal coincides with the minimum value of the other of the two signals.

5 Claims, 40 Drawing Figures

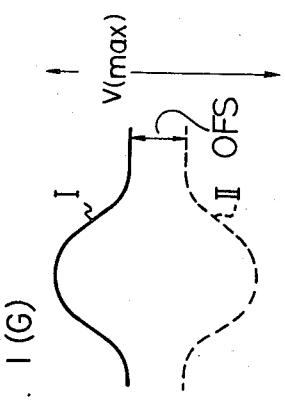
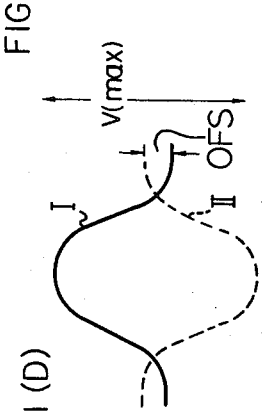
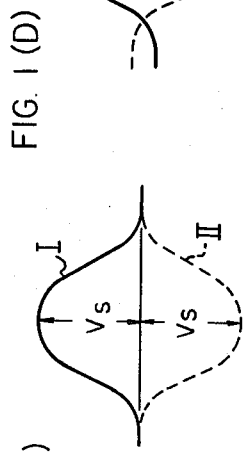
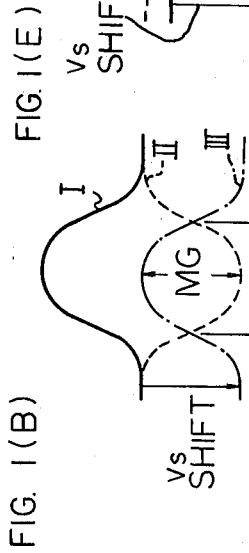
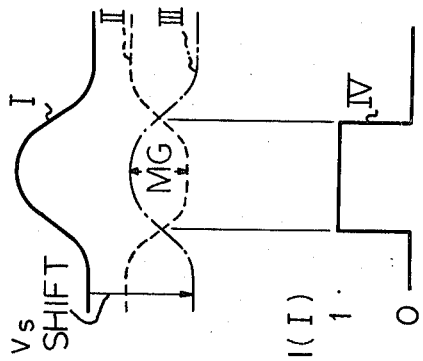
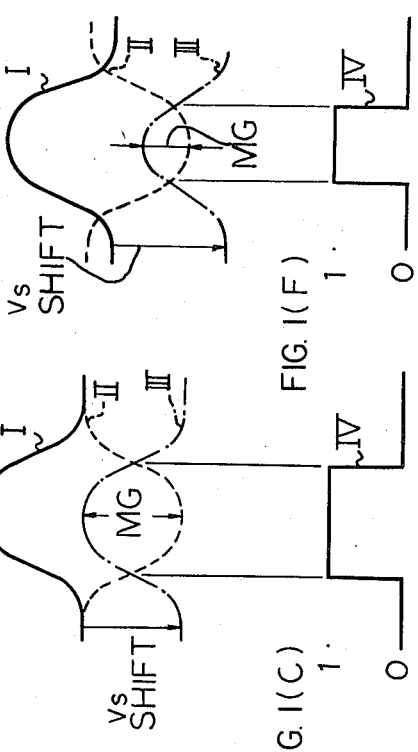
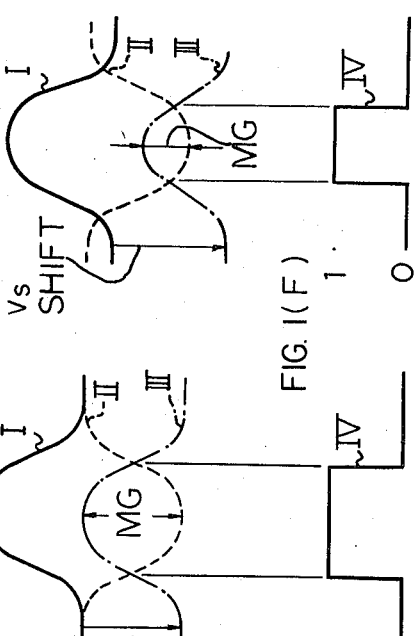

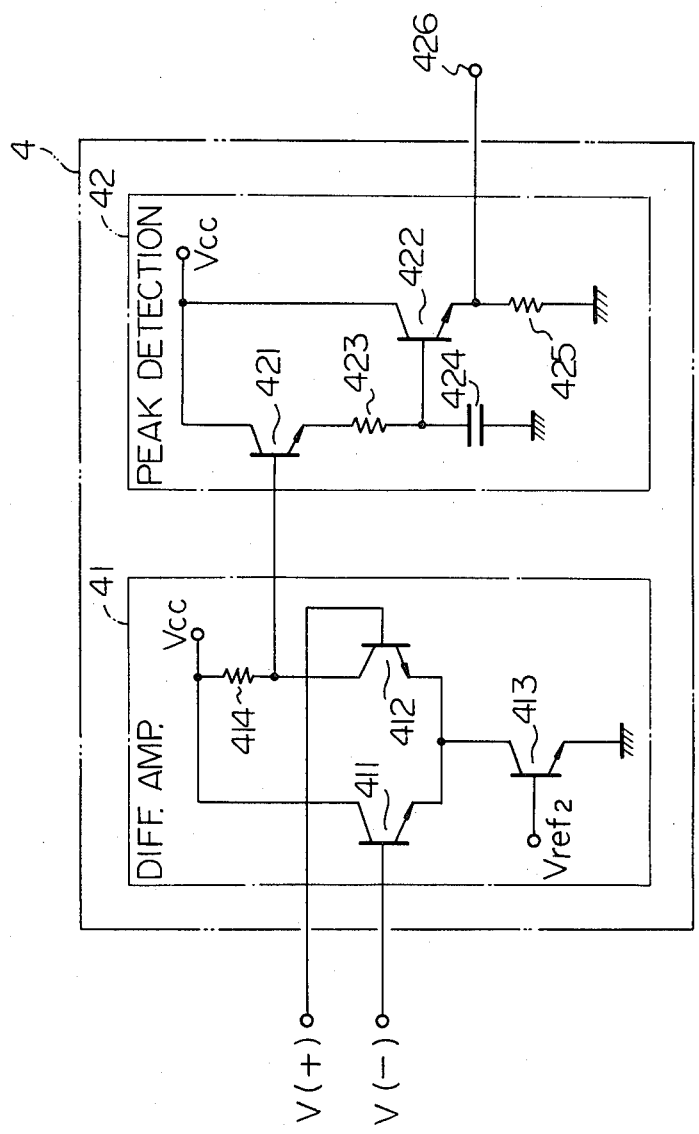

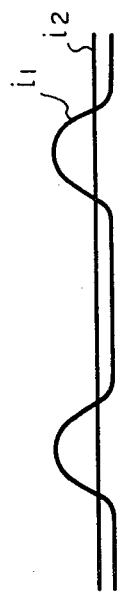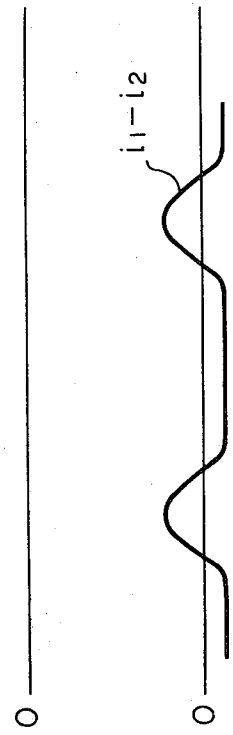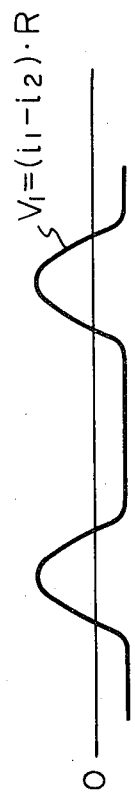
Fig. 4(A)
Fig. 4(B)
Fig. 4(C)

DEVICE FOR DISCRIMINATING BETWEEN TWO VALUES OF A SIGNAL WITH DC OFFSET COMPENSATION

BACKGROUND OF THE INVENTION

The present invention relates to a device for the discrimination between two values "1" and "0" of a signal using direct current (DC) offset compensation. The device of the present invention is used, for example, as a device for discriminating between two values of a signal in an LSI optical data link. The two values "1" and "0" of a signal in an LSI optical data link correspond to the "light is ON" state and the "light is OFF" state, respectively.

When the signal which is sent from a transmitting side and is discriminated at a receiving side, if it is impossible to obtain the central level at the receiving side by DC regeneration, a method for discriminating between the two values "1" and "0" of the received signal is carried out as illustrated in FIGS. 1(A), 1(B) and 1(C). From a received signal SIGNAL-I, the inverted signal SIGNAL-II and the shifted signal SIGNAL-III are obtained as illustrated in FIGS. 1(A) and 1(B). The amount of the shift is equal to the amplitude $v_s$ of SIGNAL-I. Comparing the two signals SIGNAL-II and SIGNAL-III, a signal SIGNAL-IV is obtained so as to represent the result of the discrimination of the received signal SIGNAL-I as illustrated in FIG. 1(C).

In this method, however, a problem is incurred if the basic levels of SIGNAL-I and SIGNAL-II do not coincide and hence a DC offset OFS is formed between SIGNAL-I and SIGNAL-II as illustrated in FIGS. 1(D) and 1(G), under a condition that the value of maximum amplitudes of SIGNAL-I and SIGNAL-II is limited within a predetermined value v(max). This is because, the discrimination margin MG formed by SIGNAL-II and SIGNAL-III is reduced as compared with the case of FIGS. 1(A), 1(B) and 1(C) as illustrated in FIGS. 1(E) and 1(H), and accordingly the discrimination of the values of the received signal cannot always be conducted correctly.

Also, a prior art method is disclosed in U.S. Pat. No. 4,027,152 in which a signal which is sent from a transmitting side and which has three values is used and the discrimination of the signal received at a receiving side is carried out by using a basic level which is obtained as the result of the integration of the received signal. However, this prior art method requires a process of making the three valued signal and causes a reduction for the discrimination margin because of the use of the three valued signal. Therefore, this prior art cannot provide a complete solution for the discrimination of the received signal having plural values.

SUMMARY OF THE INVENTION

It is an object of this invention to provide an improved device for discriminating between two values of a signal using DC offset compensation, in order to solve the above described problems.

In accordance with the present invention, there is provided a device for discriminating between two values of a signal using DC offset compensation including: an automatic gain control circuit for receiving an incoming signal ($V_1$) to produce a signal V(+) having the same polarity as the incoming signal and a signal V(−) having the opposite polarity to that of the incoming signal, and a peak detector device for receiving the same polarity signal V(+) and the opposite polarity signal V(−) to control the value of a feedback current. The device also includes a feedback path for connecting the output of the peak detector device with the input circuit of the automatic gain control circuit and a comparator for receiving the same polarity signal V(+) and the opposite polarity signal V(−) through a level circuit to produce a two value discriminated output signal. The value of the feedback current is regulated so that the maximum value of one of the same polarity signal V(+) and the opposite polarity signal V(−) coincides with the minimum value of the other of the two signals.

BRIEF DESCRIPTION OF THE DRAWINGS

FIGS. 1(A) through 1(I) illustrate the relationships between an original signal, the inverted signal and the shifted signal for explaining the problem of discriminating between the values of a received signal, FIGS. 2 and 3 illustrate an embodiment of the present invention, FIGS. 4(A) through 4(G) and 5(A) through 5(G) illustrate the waveforms of the signals present in the circuit of FIGS. 2 and 3, FIGS. 6, 7 and 8 illustrate another embodiment of the present invention.

DESCRIPTION OF THE PREFERRED EMBODIMENTS

Figure 2:
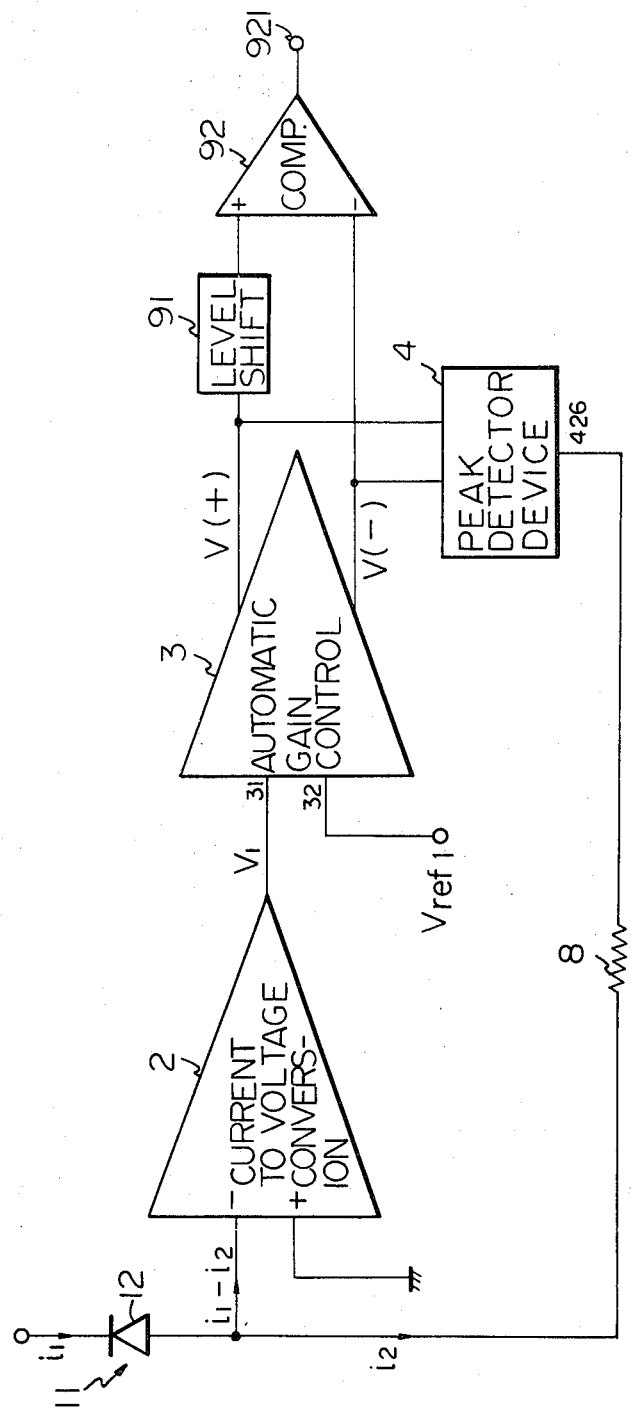
Figure 4D:
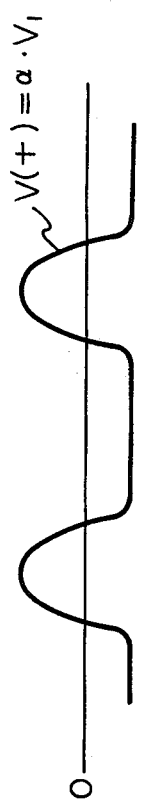
Figure 4E:
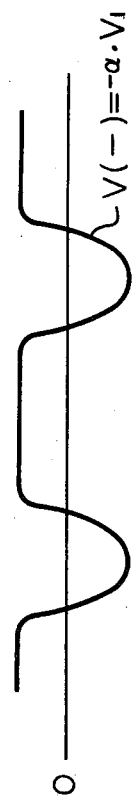
Figure 4F:
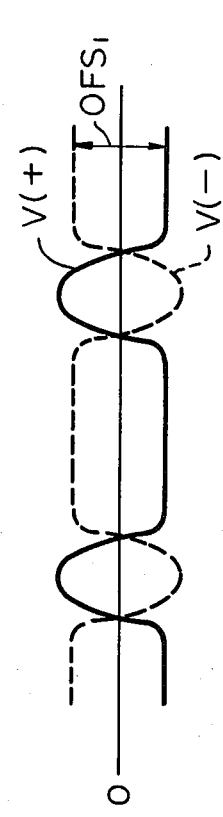
Figure 4G:
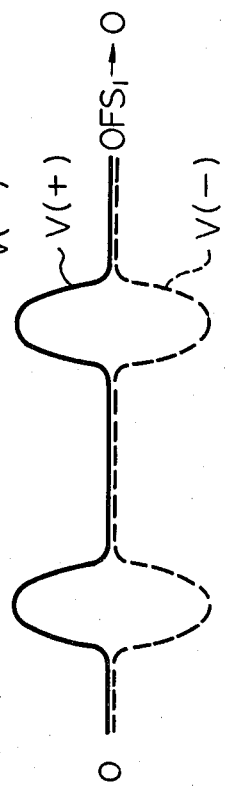
Figure 5A:
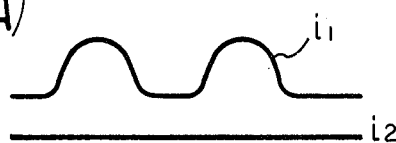
Figure 5B:
Figure 5C:
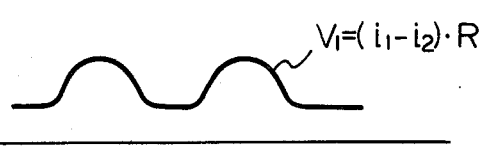
Figure 5D:
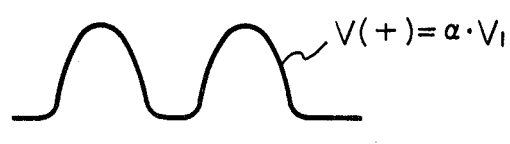
Figure 5E:
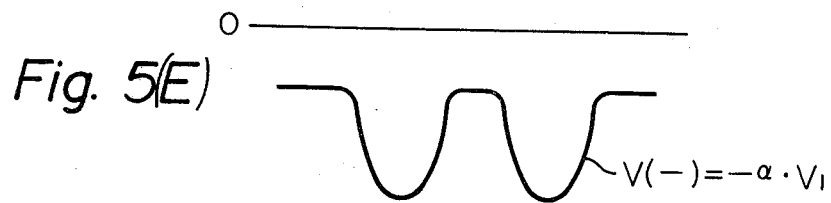
Figure 5F:
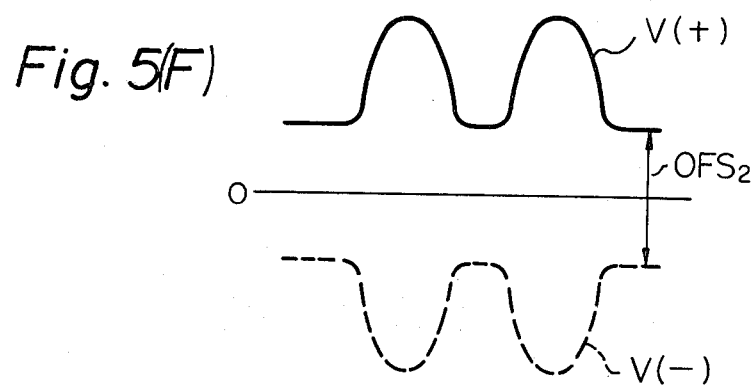
Figure 5G:
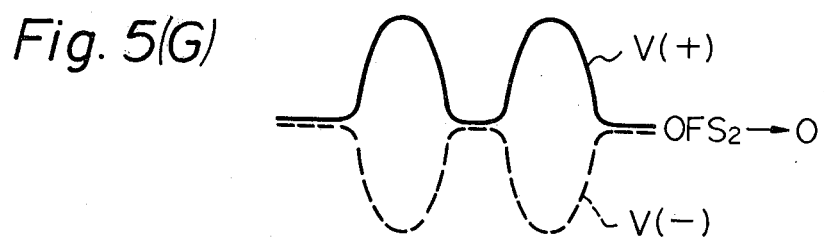

The circuit of a device for discriminating between two values of a signal using DC offset compensation as an embodiment of the present invention is illustrated in FIGS. 2 and 3, where FIG. 3 illustrates the peak detector device 4 of the circuit of FIG. 2.

An input signal is supplied to one input terminal of a current to voltage conversion circuit 2. The input signal represents the value "$i_1 - i_2$" where $i_1$ is the current generated by a photodiode 12 irradiated by a light beam 11 and $i_2$ is the feedback current. The output signal $V_1$ of the current to voltage conversion circuit 2 is supplied to one input terminal 31 of an automatic gain control circuit 3, while a reference signal $V_{ref1}$ is supplied to the other input terminal 32. The value of the signal $V_1$ is equal to the value "$i_1 - i_2$" multiplied by the value R where R represents a predetermined resistance value.

$$V_1 = (i_1 - i_2) \cdot R \tag{1}$$

The automatic gain control circuit 3 produces the output signals V(+) and V(−) which are expressed as follows:

$$V(+) = \alpha \cdot V_1 \tag{2}$$

$$V(-) = -\alpha \cdot V_1 \tag{3}$$

where $\alpha$ is the amplification factor of the automatic gain control circuit 3. The signal V(+) is of the same polarity as the signal $V_1$, while the signal V(−) is the opposite polarity of that of the signal $V_1$. The produced signals V(+) and V(−) are supplied to the input terminals of a peak detector device 4. An example of the structure of the peak detector device 4 is illustrated in FIG. 3.

The peak detector device 4 consists of a differential amplifier circuit 41 and a peak detection circuit 42. The differential amplifier includes transistors 411, 412 and 413 so that the subtraction "$V(-)-V(+)$" is carried out. The maximum value of the result of this subtraction is stored in a capacitor 424 in the peak detection circuit 42.

If $V(-)-V(+)>0$, the transistor 421 turns ON and hence the capacitor 424 is charged up under the control of a time constant determined by the capacitor 424 and a resistor 423 to increase the voltage of the capacitor 424 so that the voltage across the resistor 425 is increased. Due to the increase of the voltage across the resistor 425, the voltage at the output terminal 426 of the peak detector device 4 is increased and hence the feedback current $i_2$ passing through a feedback resistor 8 is decreased. Thus, the value of $i_2$ is decreased to approach the basic value of $i_1$ of the current of the photodiode 12 so that the minimum value of $V(+)$ and the maximum value of $V(-)$ tend to become equal.

Contrary to the above, if $V(-)-V(+)<0$, the transistor 421 turns OFF and hence the charge stored in the capacitor 424 is slowly discharged under the control of a time constant determined by the capacitor 424, a resistor 425 and the current amplification factor of a transistor 422 to decrease the voltage of the capacitor 424 so that the voltage across the resistor 425 is decreased. Due to the decrease of the voltage across the resistor 425, the voltage at the output terminal 426 of the peak detector device 4 is decreased and hence the feedback current $i_2$ passing through a feedback resistor 8 is increased. Thus, the value of $i_2$ is increased to approach the basic value of $i_1$ of the current of the photodiode 12 so that the minimum value of $V(+)$ and the maximum value of $V(-)$ tend to become equal.

The operation of the circuit of FIGS. 2 and 3 is illustrated in FIGS. 4(A) through 4(G) and 5(A) through 5(G). FIGS. 4(A) through 4(G) corresponds to the case where $V(-)-V(+)>0$, while FIGS. 5(A) through 5(G) corresponds to the case where $V(-)-V(+)<0$.

With regard to FIGS. 4(A) through 4(G), the state of the signals present in the circuit of FIG. 2 is illustrated in FIGS. 4(A) through 4(F) and an offset OFS exists between the basic levels of $V(+)$ and $V(-)$. As the result of the operation of the circuit of FIG. 2, the state of $V(+)$ and $V(-)$ changes into the state illustrated in FIG. 4(G) in which the offset OFS, approaches zero.

With regard to FIGS. 5(A) through 5(G), the state of the signals present in the circuit of FIG. 2 is illustrated in FIGS. 5(A) through 5(F) and an offset $OFS_2$ exists between the basic levels of $V(+)$ and $V(-)$. As a result of the operation of the circuit of FIG. 2, the state of $V(+)$ and $V(-)$ changes into the state illustrated in FIG. 5(G) in which the offset $OFS_2$ approaches zero.

In consequence, the offset between the basic levels of the signal $V(+)$ and the signal $V(-)$ is eliminated achieving the DC offset compensation, and accordingly the discrimination of the value of the received signal is carried out correctly.

The output signals $V(+)$ and $V(-)$ of the automatic gain control circuit 3 are supplied through a level shift circuit 91 to a comparator 92 to produce an output signal either "1" or "0" as the result of the discrimination of the received signal.

Although, in the above described embodiment, the wave form of the received signal is such that the waveform is situated above the basic level, it is also possible to use a received signal having such a waveform situated below the basic level. However, it should be noted that the maximum value of $V(+)$ and the minimum value of $V(-)$ are to be equalized in the case where such waveform is situated below the basic level.

Figure 6:
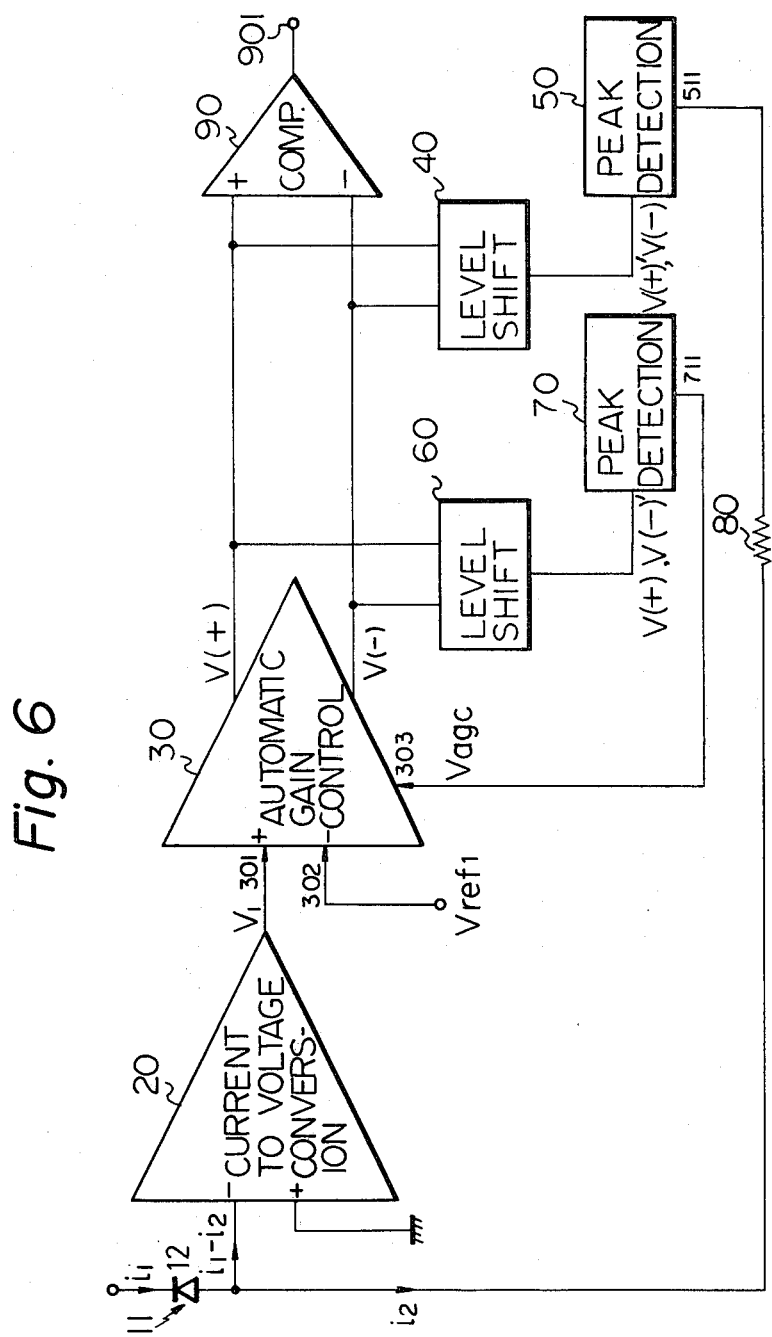
Figure 7:
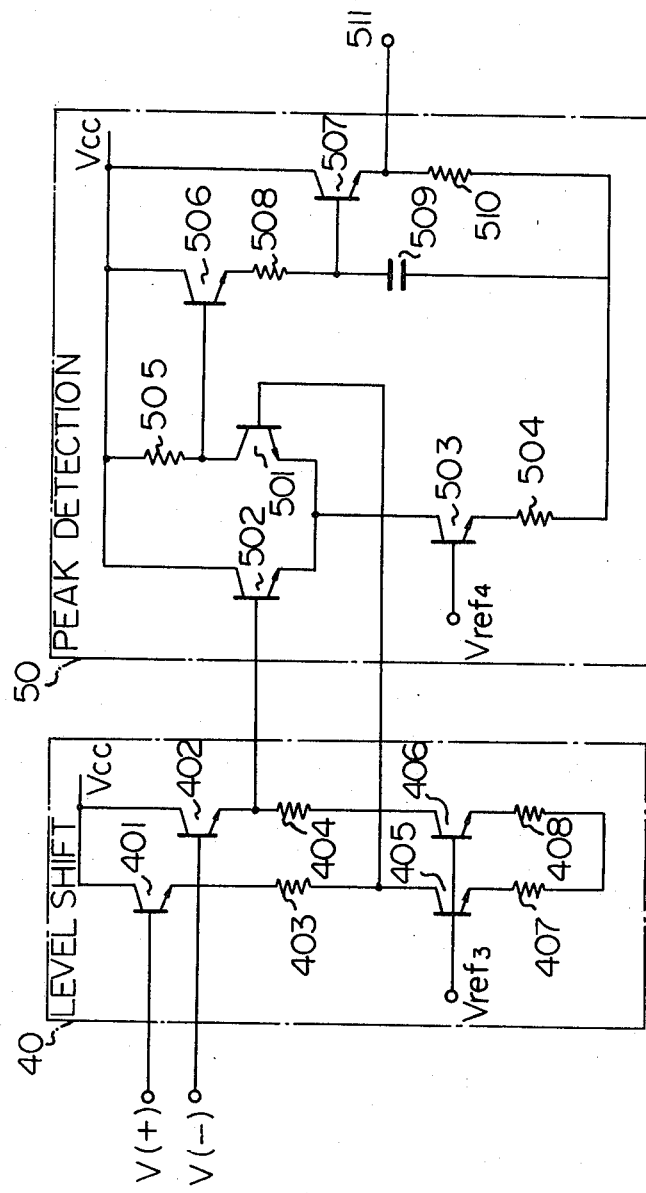
Figure 8:
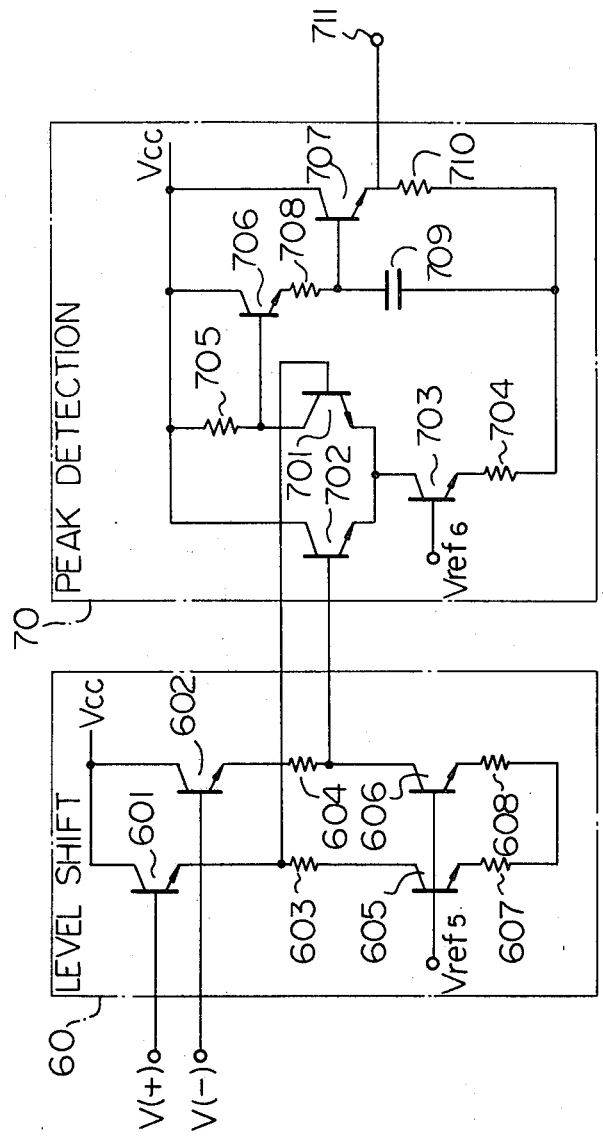

The circuit of a device for discriminating between two values of a signal using DC offset compensation and automatic gain control of another embodiment of the present invention is illustrated in FIGS. 6, 7 and 8, where FIGS. 7 and 8 illustrate the level shift circuits 40 and 60 and the peak detection circuits 50 and 70 of the circuit of FIG. 6.

The output signal $V_1$ of a current to voltage conversion circuit 20 is supplied to one input terminal 301 of an automatic gain control amplifier circuit 30. A reference voltage $V_{ref1}$ is supplied to the other input terminal 302 of the automatic gain control amplifier circuit 30. An automatic gain control feedback signal $V_{agc}$ is supplied to the feedback terminal 303 of the automatic gain control amplifier circuit 30. Assuming that the amplification factor of the automatic gain control amplifier circuit 30 is $\alpha$, the open loop gain is $\alpha_m$ and the control factor is $\gamma$, the following equation is obtained.

$$\alpha = \alpha_m(1 - \gamma V_{agc}) \tag{4}$$

The automatic gain control amplifier circuit 30 produces a signal $V(+)$ which has the same polarity as the input signal $V_1$ and a signal $V(-)$ which has the opposite polarity of that of the input signal $V_1$. The produced signals $V(+)$ and $V(-)$ are supplied to a first level shift circuit 40 and to a second level shift circuit 60. The output of the first level shift circuit 40 is supplied to a first peak detection circuit 50, the output signal $i_2$ is supplied as a DC feedback signal through a feedback resistor 80 to the input circuit of the current to voltage conversion circuit 20. The output of the second level shift circuit 60 is supplied to a second peak detection circuit 70 which generates the output signal $V_{agc}$ which is supplied as an automatic gain control feedback signal to the feedback terminal 303 of the circuit 30.

The details of the level shift circuit 40 and the peak detection circuit 50 are illustrated in FIG. 7. The level shift circuit comprises transistors 401 and 402. To the bases of the transistors 401 and 402 the signal $V(+)$ and the signal $V(-)$ are supplied, respectively. The signal $V(+)$ is level shifted, by a predetermined value $v_s$, to become the signal $V(+)'$ due to the existence of a resistor 403. The shifted signal $V(+)'$ is supplied to the base of a transistor 501 in the peak detection circuit. The signal $V(-)$ is supplied to the base of a transistor 502. The difference between the values $V(+)'$ and $V(-)$ which is obtained in the peak detection circuit 50 is supplied to a circuit consisting of a resistor 508, a capacitor 509, a transistor 507 and a resistor 510.

The capacitor 509 is charged under the control of a time constant determined by the capacitor 509 and the resistor 508 and discharged under the control of a time constant determined by the capacitor 509, the resistor 510 and the current amplification factor of the transistor 507. Thus, a DC feedback current $i_2$ flows between the output terminal 511 of the peak detection circuit 50 and one of the inputs of the current to voltage conversion circuit 20 through a feedback resistor 80. The DC feedback is carried out so that the minimum value of the opposite polarity signal $V(-)$ coincides with the maximum value of the shifted same polarity signal $V(+)'$.

The operation of the circuit of FIG. 7 is illustrated in FIGS. 9(A) through 9(C) and 10(A) through 10(C). It can be understood that the relationship between (V−) and V(+)' in FIGS. 9(B) and 10(B) corresponds to the relationship between V(+) and V(−) in FIGS. 4(F) and 5(F) for the operation of the circuit of FIG. 3.

The details of the level shift circuit 60 and the peak detection circuit 70 are illustrated in FIG. 8. The level shift circuit comprises transistors 601 and 602. To the bases of the transistors 601 and 602 the signal (V+) and the signal V(−) are supplied, respectively. The signal V(−) is level shifted, by a predetermined value $v_s$, to become the signal V(−)' due to the existence of a resistor 604. The shifted signal V(−)' is supplied to the base of a transistor 702 in the peak detection circuit 70. The signal V(+) is supplied to the base of a transistor 701. The difference between the values V(−)' and V(+) which is obtained in the peak detection circuit 70 is supplied to a circuit consisting of a resistor 708, a capacitor 709, a transistor 707 and a resistor 710.

The capacitor 709 is charged under the control of a time constant determined by the capacitor 709 and the resistor 708 and discharged under the control of a time constant determined by the capacitor 709, the resistor 710 and the current amplification factor of the transistor 707. Thus, an automatic gain control signal $V_{agc}$ is sent from the output terminal 711 of the peak detection circuit 70 and is supplied to the feedback terminal 303 of the automatic gain control circuit 30. The automatic gain control is carried out so that the minimum value of the same polarity signal V(+) coincides with the maximum value of the shifted opposite polarity signal V(−)'.

The operation of the circuit of FIG. 8 is illustrated in FIGS. 11(A) through 11(C) and 12(A) through 12(C). It can be understood that the relationship between V(+) and V(−)' in FIGS. 11(B) and 12(B) corresponds to the relationship between V(+) and V(−) in FIGS. 4(F) and 5(F) for the operation of the circuit of FIG. 3.

Figure 9A:
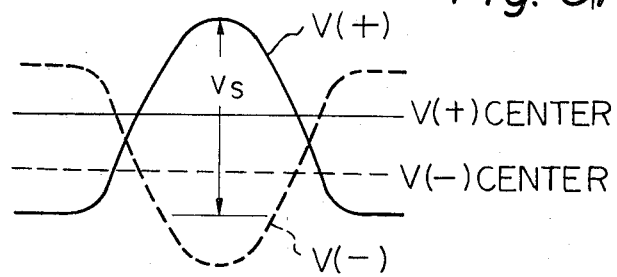
FIGS. 9(A) through 9(C), 10(A) through 10(C), 11(A) through 11(C) and 12(A) through 12(C) illustrate the waveforms of the signals present in the circuit of FIGS. 6, 7 and 8.
Figure 9B:
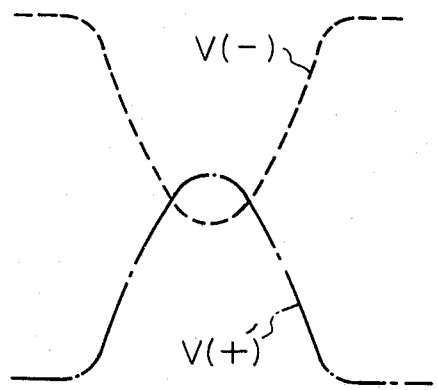
Figure 10A:
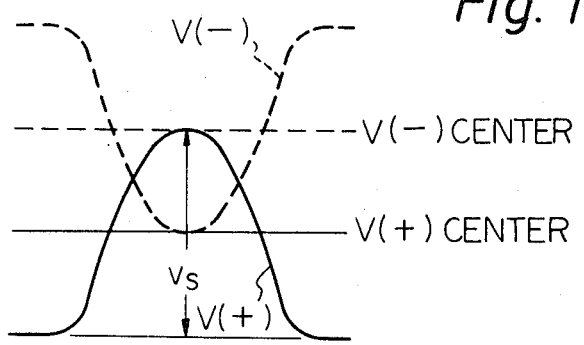
Figure 10B:
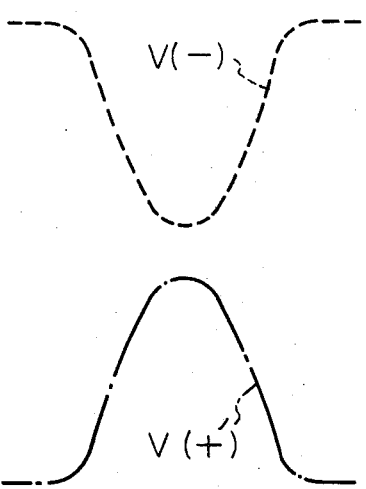

FIGS. 9(A) and 10(A) illustrate the state before the feedback for DC compensation is carried out. The difference between the V(+) center level and the V(−) center level is equal to "$\alpha(v_c - V_{ref1})$", where $\alpha$ is the amplification factor of the automatic gain control amplifier circuit 30, $v_c$ is the voltage of the center level of the signal $V_1$ and $V_{ref1}$ is the reference voltage.

Figure 9C:
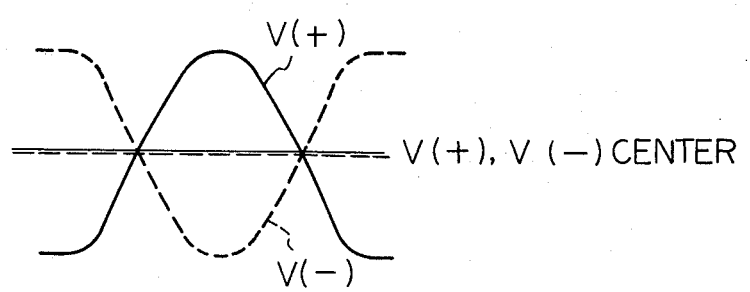
Figure 10C:
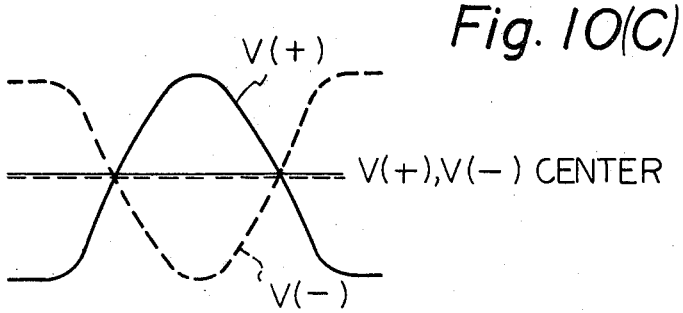

As the result of the feedback for DC compensation the difference tends to become zero as illustrated in FIGS. 9(C) and 10(C).

Figure 11A:
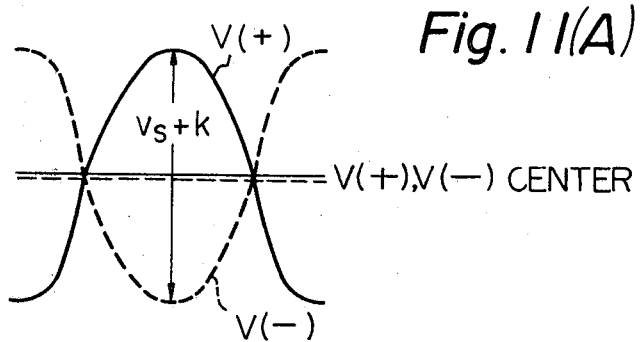
Figure 11B:
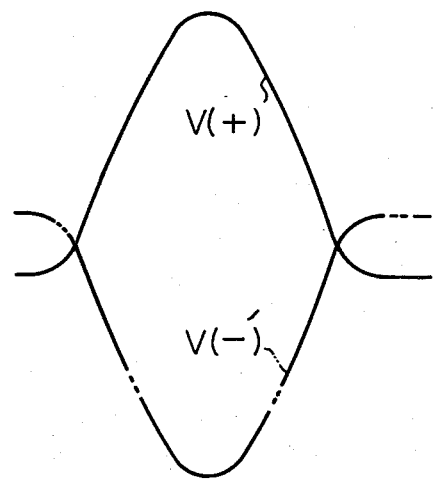
Figure 12A:
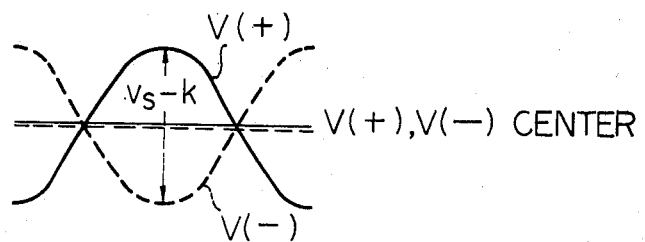
Figure 12B:
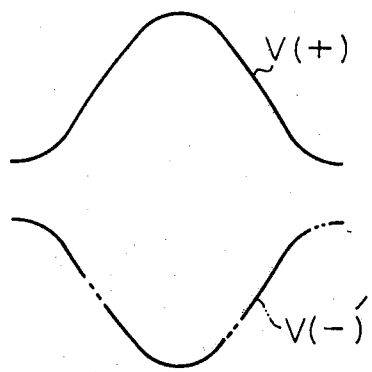

FIGS. 11(A) and 12(A) illustrate the state before the feedback for automatic gain control is carried out. It is assumed that the amplitude of each of V(+) and V(−) is not equal to $v_s$ but equal to either "$v_s+k$" or "$v_s-k$" where k is a predetermined value. The value "$v_s+k$" is equal to "$\alpha(v_a - V_{ref1})$", where $v_a$ is the amplitude of the signal $V_1$.

Figure 11C:
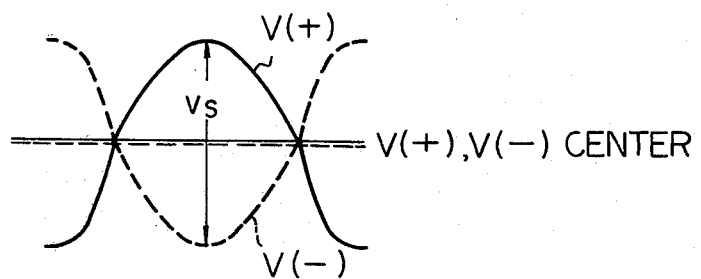
Figure 12C:
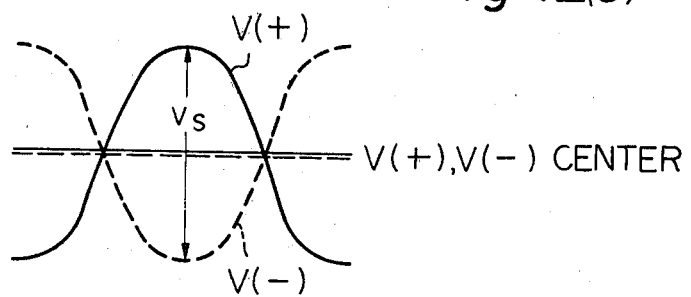

As a result of the feedback for automatic gain control the amplitude of each of V(+) and V(−) tends to become equal to $v_s$ as illustrated in FIGS. 11(C) and 12(C).

The output signals V(+) and V(−) of the automatic gain control circuit 3 are supplied to a comparator 90 to produce an output signal either "1" or "0" as a result of discrimination the received signal.

We claim:

1. A device for discriminating between two values of a signal using DC offset compensation, comprising:
    an automatic gain control circuit, having an input, for receiving an incoming signal and for generating both a same polarity signal having the same polarity as said incoming signal and an opposite polarity signal having opposite polarity to that of said incoming signal;
    a peak detector device, operatively connected to said automatic gain control circuit, for receiving said same polarity signal and said opposite polarity signal and for generating and controlling the value of a feedback current;
    a feedback path for connecting the output of said peak detector device with the input of said automatic gain control circuit;
    a level shift circuit, operatively connected to said automatic gain control circuit, for generating a shifted same polarity signal by shifting the level of said same polarity signal; and
    a comparator, operatively connected to said level shift circuit and said automatic gain control circuit, for receiving said shifted same polarity signal and said opposite polarity signal through said level shift circuit and for generating a two value discriminated output signal in dependence upon said shifted same polarity signal and said opposite polarity signal, wherein the value of said feedback current is regulated so that the maximum value of one of said same polarity signal and said opposite polarity signal coincides with the minimum value of the other of said two polarity signals.

2. A device for discriminating between two values of a signal using DC offset compensation and automatic gain control, comprising:
    an automatic gain control circuit, having an input and a feedback terminal, for receiving an incoming signal and for generating both a same polarity signal having the same polarity as said incoming signal and an opposite polarity signal having opposite polarity to that of said incoming signal;
    a first level shift circuit, operatively connected to said automatic gain control circuit, for generating a shifted same polarity signal by shifting said same polarity signal and for passing therethrough said opposite polarity signal;
    a first peak detection circuit, operatively connected to said first level shift circuit, for receiving the output of said first level shift circuit and for peak-detecting the difference between said shifted same polarity signal and said opposite polarity signal;
    a second level shift circuit, operatively connected to said automatic gain control circuit, for generating a shifted opposite polarity signal by shifting said opposite polarity signal and for passing therethrough said same polarity signal;
    a second peak detection circuit, operatively connected to said second level shift circuit, for receiving the output of said second level shift circuit and for peak-detecting the difference between said shifted opposite polarity signal and said same polarity signal;
    a first feedback path for connecting the output of said first peak detection circuit with the input of said automatic gain control circuit to effect DC feedback;
    a second feedback path for connecting the output of said second peak detection circuit with the feedback terminal of said automatic gain control circuit to effect automatic gain control; and
    a comparator, operatively connected to said automatic gain control circuit, for receiving said same polarity signal and said opposite polarity signal, for generating a two value discriminated output signal, wherein said DC feedback by said first feedback path is carried out so that the minimum value of said opposite polarity signal coincides with the maximum value of said shifted same polarity signal.

3. A device as defined in claim 2, wherein said automatic gain control by said second feedback path is carried out so that the minimum value of said same polarity signal coincides with the maximum value of said shifted opposite polarity signal.

4. A device for discriminating between two values of an incoming signal, comprising:
   an automatic gain control circuit, operatively connectable to receive the incoming signal, for generating a first signal and a second signal;
   a level shift circuit, operatively connected to said automatic gain control circuit, for shifting the first signal by a predetermined value;
   a peak detector, operatively connected to said automatic gain control circuit, for detecting the peak of a difference between the first and the second signal and for generating a feedback signal in dependence on said difference, said automatic gain control circuit generating the first and second signals in dependence upon the feedback signal and the incoming signal; and
   a comparator, operatively connected to said automatic gain control circuit and to said level shift circuit, for comparing the second signal with the shifted first signal and for generating a discriminated signal in dependence upon the comparison, so that the two values of the incoming signal are discriminated.

5. A device for discriminating between two values of an incoming signal, comprising:
   an automatic gain control circuit, operatively connectable to receive the incoming signal, for generating a first signal and a second signal;
   a first level shift circuit, operatively connected to said automatic gain control circuit, for shifting the first signal by a first predetermined value and for passing therethrough the second signal;
   a first peak detector circuit, operatively connected to said first level shift circuit and to said automatic gain control circuit, for detecting the peak of a first difference between the shifted first signal and the second signal and for generating a feedback signal in dependence on the first difference;
   a second level shift circuit, operatively connected to said automatic gain control circuit, for shifting the second signal by a second predetermined value and for passing therethrough the first signal;
   a second peak detector, operatively connected to said second level shift circuit and to said automatic gain control circuit, for detecting the peak of a second difference between the shifted second signal and the first signal and for generating the gain control signal in dependence on the second difference, said automatic gain control circuit generating the first and second signals in dependence upon the incoming signal, the feedback signal and the gain control signal; and
   a comparator, operatively connected to said automatic gain control circuit, for comparing the second signal and the first signal and for generating a discriminated signal in dependence upon the comparison, so that the two values of the incoming signal are discriminated.

* * * * *

UNITED STATES PATENT AND TRADEMARK OFFICE
CERTIFICATE OF CORRECTION

PATENT NO. : 4,363,977
DATED : December 14, 1982
INVENTOR(S) : TOSHITAKA TSUDA ET AL.

It is certified that error appears in the above—identified patent and that said Letters Patent is hereby corrected as shown below:

Column 1, line 50, "for" should be --of--.

Signed and Sealed this

Thirty-first Day of May 1983

[SEAL]

Attest:

DONALD J. QUIGG

Attesting Officer     Acting Commissioner of Patents and Trademarks